United States Patent [19]

Chen et al.

[11] Patent Number: 4,486,511
[45] Date of Patent: Dec. 4, 1984

[54] SOLDER COMPOSITION FOR THIN COATINGS

[75] Inventors: Yung-Shih Chen, San Jose; Jagdish G. Belani, Cupertino; Vijay Sajja, Sunnyvale, all of Calif.

[73] Assignee: National Semiconductor Corporation, Santa Clara, Calif.

[21] Appl. No.: 508,376

[22] Filed: Jun. 27, 1983

[51] Int. Cl.³ .......................... H02B 1/04; H05K 3/28
[52] U.S. Cl. .................................. 428/620; 428/643; 75/0.5 R; 357/67
[58] Field of Search .............. 428/620, 643; 75/0.5 R; 357/67

[56] References Cited

U.S. PATENT DOCUMENTS

| | | | |
|---|---|---|---|
| 3,495,133 | 2/1970 | Miller | 357/67 |
| 3,729,820 | 5/1973 | Ihochi et al. | 357/67 |
| 3,735,208 | 5/1973 | Roswell et al. | 357/67 |
| 3,761,309 | 9/1973 | Schmitter et al. | 428/620 |
| 4,097,266 | 6/1978 | Takahashi et al. | 75/0.5 R |
| 4,273,859 | 6/1981 | Mones et al. | 357/67 |

FOREIGN PATENT DOCUMENTS 130433  11/1977  Japan .................................. 428/643

OTHER PUBLICATIONS

Metals Handbook 9th Ed., vol. 2, Prop. and Selections: Nonferrous Alloys and Pure Metals, Am. So. Metals, Metals Park, Ohio, pp. 620-621, 1981.

Primary Examiner—Veronica O'Keefe
Attorney, Agent, or Firm—Paul J. Winters; Michael J. Pollock; Gail W. Woodward

[57] ABSTRACT

A solder composition of 10 to 40 percent tin, with the balance lead, for use in thin layers of 50 to 500 microinches on copper integrated circuit leads so as to resist the formation of intermetallics when later heated.

5 Claims, 1 Drawing Figure

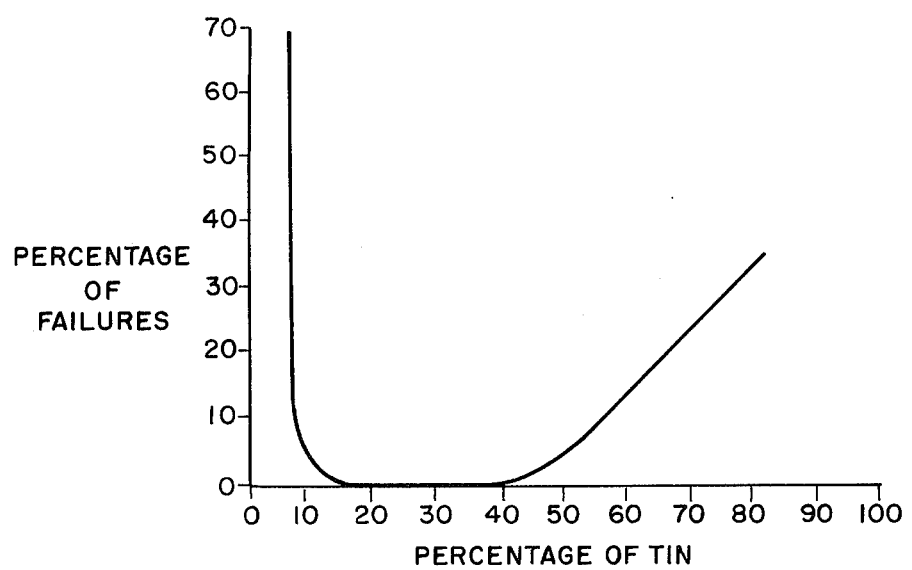

SOLDER COMPOSITION FOR THIN COATINGS

BACKGROUND OF THE INVENTION

The electrical contact leads of integrated circuits are often coated with a thin layer of solder, by plating or other techniques, so as to improve their connection and solderability characteristics. This classically has been done after the chip has been assembled and using hot dip processes which result in relatively thick solder coatings. A newer, more efficient process has been recently adopted, called pre-plating, in which the solder is deposited before assembly so as to increase productivity. However, the pre-plated solder layer is necessarily quite thin because of the stringent dimensional requirements and productivity requirements that the leads must meet. The lead base materials are usually copper or nickel alloys.

A severe problem arises with these new thin coatings, however, because industry practice requires severe quality control tests for integrated circuits which include subjecting the parts to high temperatures of 155–175 degrees centigrade for extended periods of many hours to test the integrity of the part. Also, the assembly process involves the application of heat to cure the molded DIPS. This additional heat sometimes affected the solderability of prior art pre-plated leads which did not become apparent until the part actually reached the end user who had difficulty in properly soldering the part into a circuit board. After an extensive investigatory program, it was discovered that a close control of the lead to tin ratio in the solder will eliminate later burnin induced solderability problems for thin layers of solder on copper, nickel, or other base materials that can form intermetallics with tin.

SUMMARY OF THE INVENTION

The type of solder layer used on pre-plated integrated circuit leads ranges from 50 to 500 micro inches in thickness. Layers this thin, when subjected to temperatures of 175 degrees centigrade for up to 24 hours, followed by 155 degrees for 160 hours, can form intermetallic compositions with the base metal, especially if the base metal is copper or nickel containing material. These intermetallic compositions may extend all the way through the thin layer in some cases and seriously degrade the solderability characteristics of the leads. We have found that this degradation can be avoided, while still retaining other necessary solder characteristics if the solder is constrained to a range of 10 to 40 percent tin with the balance comprising lead. The preferred range is from 25 to 35 percent tin. This contrasts with the industry wide common practice of using about 60% tin and 40% lead compositions for lead frame solder coatings.

BRIEF DESCRIPTION OF THE DRAWING

The drawing shows a composite graph, developed from extensive empirical testing, that correlates the percentage solderability failures as a function of the percentage tin in the solder.

BRIEF DESCRIPTION OF THE PREFERRED EMBODIMENT

The graph was developed from tests of thin solder coatings in the range of 100 to 300 microinches on copper bases. Solderability problems caused failures at high rates for compositions having less than 10% or more than 40% tin. Too much tin allowed the excessive formation of intermetallics with the base material. Too little tin produced other unacceptable solder characteristics. It was determined that the preferred range of composition would be from 25 to 35 percent tin with the balance lead.

We claim:

1. A solder composition for use on integrated circuit lead containing a base metal which can form intermetallic compositions with the solder, the solder composition consisting of ten to forty percent (10–40%) tin with the remainder being lead, so as to avoid serious degradation of the solderability characteristic thereof due to the formed intermetallics.

2. The composition of claim 1 in which the range of tin is held between twenty-five and thirty-five percent (25–35%) with the remainder being lead.

3. The composition of claim 1 in which the solder is between fifty and five hundred (50–500) microinches in thickness.

4. An integrated circuit device having pre-plated leads coated with a solder composition consisting of ten to forty percent (10–40%) tin with the remainder lead.

5. The device of claim 4 in which the solder composition consists of twenty-five to thirty-five percent (25–35%) tin with the remainder being lead.

* * * * *